United States Patent [19]
Gaultier

[11] Patent Number: 6,111,426
[45] Date of Patent: *Aug. 29, 2000

[54] LOGIC SIGNAL OUTPUT BUFFER CIRCUIT

[75] Inventor: Jean-Marie Gaultier, Rousset, France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/926,814

[22] Filed: Sep. 9, 1997

[30] Foreign Application Priority Data

Sep. 18, 1996 [FR] France ................................... 96 11533

[51] Int. Cl.$^7$ ...................... H03K 17/16; H03K 19/003; H03K 19/0175
[52] U.S. Cl. ................................ 326/26; 326/83; 326/57; 327/91
[58] Field of Search ................................ 326/26, 27, 56, 326/57, 58, 83, 86, 46, 93; 327/91, 97, 199; 365/189.05

[56] References Cited

U.S. PATENT DOCUMENTS

| | | | |
|---|---|---|---|
| 4,680,491 | 7/1987 | Yokouchi et al. | 326/86 |
| 4,685,103 | 8/1987 | Black | 327/199 |
| 5,289,518 | 2/1994 | Nakao | 326/93 |
| 5,387,824 | 2/1995 | Michelsen | 326/83 |
| 5,426,682 | 6/1995 | Takatsu | 326/93 |
| 5,459,413 | 10/1995 | Kim | 326/86 |

FOREIGN PATENT DOCUMENTS

47955 A2   3/1982   European Pat. Off. .................. 326/26

*Primary Examiner*—Michael Tokar
*Assistant Examiner*—Daniel D. Chang
*Attorney, Agent, or Firm*—Wolf, Greenfield & Sacks, P.C.; James H. Morris; Theodore E. Galanthay

[57] ABSTRACT

An output buffer circuit for logic signals produces an output logic signal from an input logic signal. It comprises a storage circuit capable of storing the logic state of the input signal and an output stage to produce the output signal as a function of the logic state stored in the storage circuit. A control circuit comprises a circuit for the comparison of the input and output signals. The control circuit produces an updating command signal whose logic state represents the relationship existing between the logic states of the input and output signals. This updating signal activates the storage, in the storage circuit, of the state of the input signal.

33 Claims, 5 Drawing Sheets

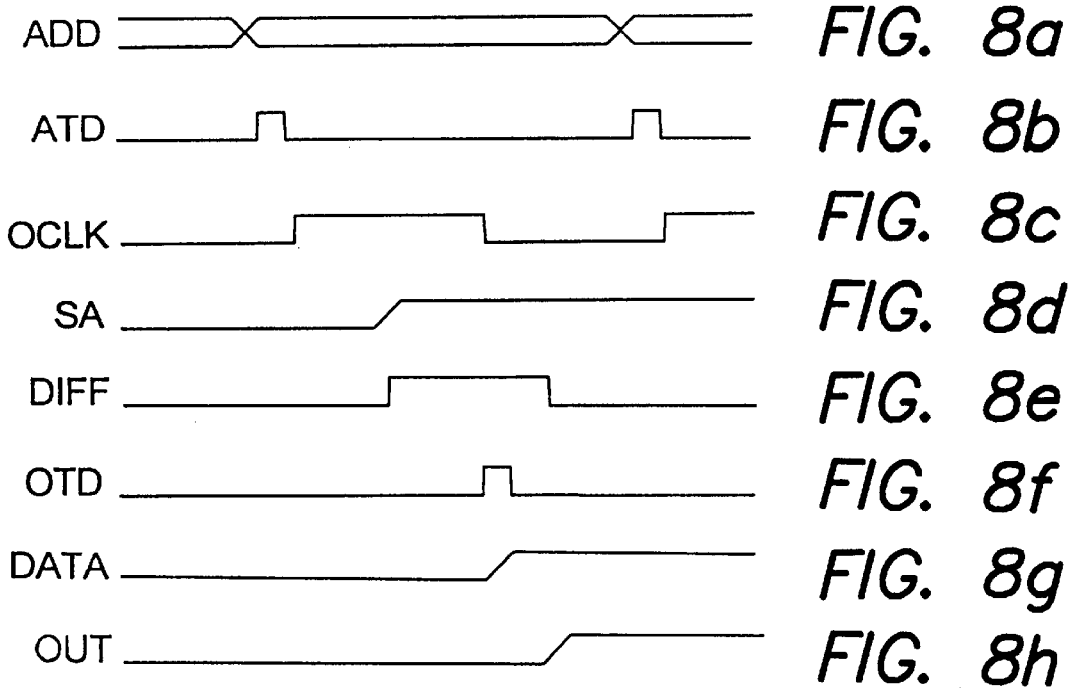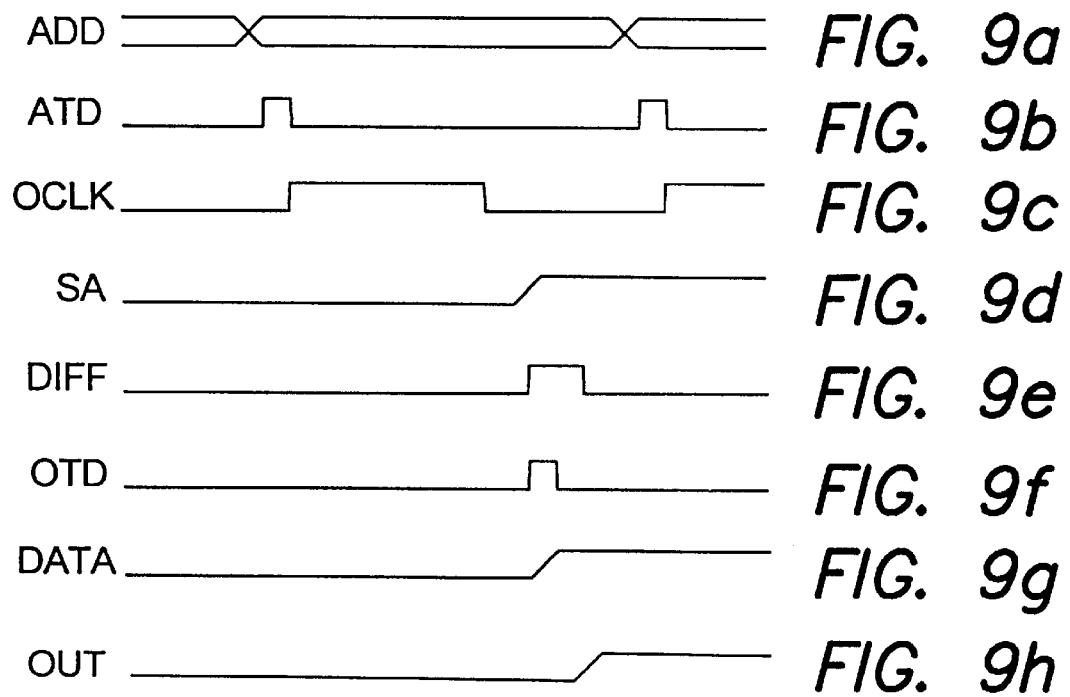

NOE

OUT

SA

DIFF

OTD

DATA

SA

OCLK

DIFF

OTD

DATA

OUT

LOGIC SIGNAL OUTPUT BUFFER CIRCUIT

BACKGROUND OF THE INVENTION

1. Field of the Invention

The invention relates to the field of output buffer circuits for outputting logic signals. It can be applied to any circuit producing logic signals, such as a memory. In a logic signal circuit, output buffer circuits are circuits generally placed between internal logic circuits and outputs or inputs/outputs of the logic signal circuit. They provide external circuits with logic signals produced by the internal circuits and match them to the electrical characteristics of the external circuits.

2. Description of the Prior Art

FIG. 1 is a summary illustration of an application of an output buffer circuit, in this case in a memory. This memory has an address input port 1 to receive addresses ADD of information to be read in the memory. These addresses are given to a decoding circuit 2 that produces the appropriate selection signals for reading, in a memory array 3, of pieces of information corresponding to the addresses received. A read circuit 4 enables the extraction of the desired information from the memory array. Information elements DATA_OUT are provided at an output port 6 in the form of logic signals, through a buffer circuit 5a.

FIG. 2 illustrates a standard example of a buffer circuit 5a. It has two series-connected inverters 7 and 8. Inverter 7 receives the signals extracted by the read circuit 4, and inverter 8 provides these signals to the ports 6. The inverter 8 is made with relatively large-sized transistors so that they can have substantial current flowing through them. This precaution arises out of the fact that the output ports are typically linked to communication buses. These buses may be of great length, and a large number of circuits other than the memory may be connected to them. Consequently, the equivalent capacitance perceived by the memory at the port 6 is generally great. The greater the current given by the memory to the port 6, the shorter will be the time taken to charge this equivalent capacitance when the memory provides signals on the port. The function of the inverter 7 is to reverse the signal provided to the inverter 8 in such a way that the polarity of the signals received and provided by the buffer circuit are identical.

If the information elements take the form of sets of N logic signals, as is the case in parallel type memories, then of course a number N of buffer circuits are used.

One problem raised by this type of buffer circuit is its sensitivity to noise. Thus, the switching in the inverters 7 and 8 of the buffer circuit illustrated in FIG. 2 may induce a disturbance of the operation in the read circuit 4 giving the logic signals. Typically, the disturbances are due to the fact that the switching generates noise in the supplies during the state transitions. This noise takes the form of glitches in the supplies, by inductive or capacitive effect. Now, the read circuits generally use differential amplifiers. This makes them highly sensitive to variations in supply potentials. It is also possible to induce oscillation phenomena between the circuit 4 and the output of the circuit 5a.

SUMMARY OF THE INVENTION

One aim of the invention is to propose an output buffer circuit that minimizes these problems of disturbance by looping between the output buffer circuit and the circuits placed upline with respect to this buffer circuit.

To do so, it is proposed to set up a temporal control over the transfer of signals to the output and to carry out the transfer only if it is necessary, firstly so as to limit any influence of the switching in the buffer circuit on the working of the circuits placed upline and secondly to eliminate any loop effect between the output and the circuits placed upline.

Thus, the invention proposes an output buffer circuit for producing an output logic signal from an input logic signal. It includes a storage circuit capable of storing the logic state of the input signal and an output stage to produce the output signal as a function of the logic state stored in the storage circuit. A control circuit, comparing the input and output signals, produces an updating command signal whose logic state represents the relationship between the logic states of the input and output signals. The updating signal activates the storage, in the storage circuit, of the state of the input signal.

BRIEF DESCRIPTION OF THE DRAWINGS

Other advantages and particular features shall appear from the following description of an exemplary embodiment of the invention, made with reference to the appended drawings, of which:

FIGS. 8a to 8h represent timing diagrams of logic signals representing the working of the buffer circuit when the state of an input signal is modified within a given time limit, FIGS. 9a to 9h represent timing diagrams of logic signals representing the operation of the buffer circuit when the state of an input signal is modified after a given time limit.

DETAILED DESCRIPTION

Figure 1:
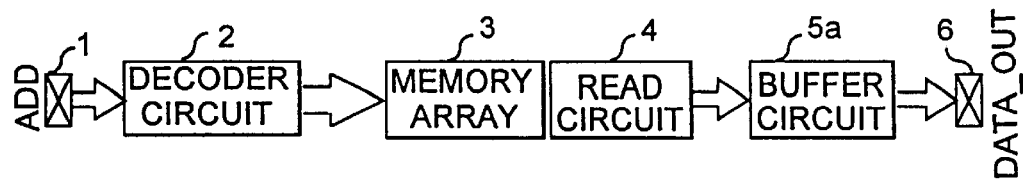
FIG. 1 gives a schematic view of a memory.

The example of a buffer circuit according to the invention, as described here below, pertains to the use of this circuit in a memory as represented in a schematic view in FIG. 1. This application is not restrictive, and the buffer circuit according to the invention can be implemented downline to any circuit producing logic signals. Furthermore, the buffer circuit is illustrated with two-state logic signals, the two states being respectively a high state and a low state. The high state will correspond to a positive supply potential VCC and the low state to a ground potential GND.

Figure 3:
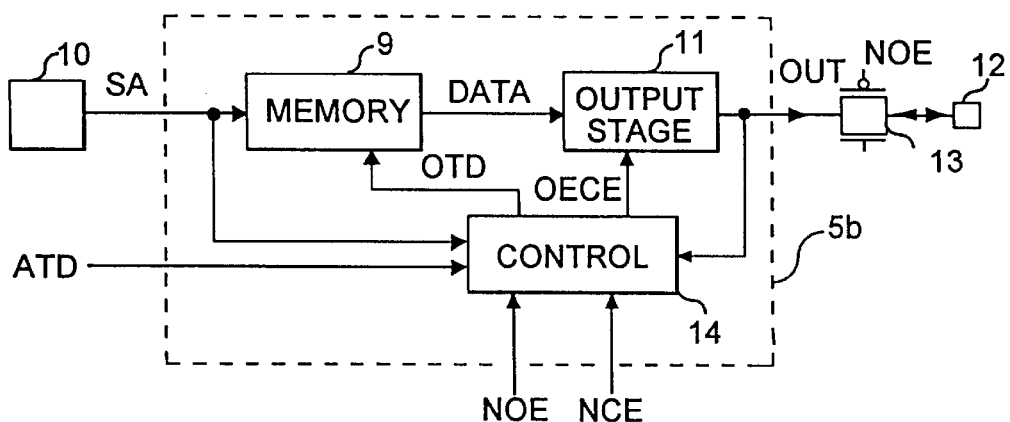
FIG. 3 shows a buffer circuit according to the invention.

FIG. 3 gives a schematic view of a logic signal output buffer circuit 5b made according to the invention. This circuit 5b receives an input logic signal SA at an input and, on the basis of this input logic signal, produces an output logic signal OUT. The signal SA is given at an output of a circuit 10 placed upline with respect to the buffer circuit. The circuit 10, in the application considered, will typically be a read amplifier producing the logic signal representing the electrical state of a storage cell of a memory array.

The signal OUT is given at an output that could be an output pin. As shown in FIG. 3, an input/output 12 is considered. In this case, the buffer circuit 5b is insulated in a standard way from the output 12 by a CMOS switch 13 controlled by a transmission direction control logic signal NOE more commonly known as an output enable logic signal. When the signal NOE is in a first state (in the example chosen in the low state), the input/output 12 is configured as an output and is connected to the circuit 5b. When the signal NOE is in a second state (in the example chosen in the high state), the input/output 12 is configured as an input and is isolated from the circuit 5b by the switch 13. The signal NOE will typically be a signal received at an input of the circuit in which the buffer circuit is used. As shall be seen hereinafter, the buffer circuit includes an output stage made so that the presence of the switch 13 is superfluous.

As shall be seen further below in greater detail, the buffer circuit 5b will be isolated from the circuit 10 during the reading phase of the circuit 10, in other words, during production of the input signal SA.

A storage circuit included in the buffer circuit 5b enables the storage of the state of the signal SA during this phase. The contents of the storage circuit are updated at controlled times so as to prevent any looping of the output in which the output signal OUT is given to the circuit 10 producing the input signal SA. Furthermore, this updating is done only if the state of the signal SA has been modified during the reading phase. If the production of the signal SA is late, and is done after the standard period needed for a reading of the memory array has elapsed, the updating is done if a difference is detected between the input signal SA and output signal OUT. Following the updating, there is a prohibition of any switch-over during the period of time needed for the switch-over in the buffer circuit, so as to prevent the appearance of glitches.

The circuit 5b includes a storage circuit or memory 9 to store the state of the input logic signal SA given by the circuit 10. The circuit 9 (shown in FIG. 6) includes a control input 9a to receive an updating control signal OTD, an input 9b to receive the signal SA and an output 9c to give an intermediate logic signal DATA whose state represents the state of the memorized signal SA.

The circuit 5b also includes an output stage 11 (illustrated in FIG. 7) which receives, at an input 43, the intermediate signal DATA. The output stage 11 produces the output signal OUT at an output 52. It includes a control input 44 to receive an enable command logic signal OECE.

The updating command signal OTD and enable signal OECE are given by a control circuit 14. This circuit has inputs to receive the input signal SA and output signal OUT, the transmission direction control signal NOE and standard control signals which are a circuit selection or chip enable signal NCE and an address transition detection signal ATD.

The chip enable signal NCE is a logic signal given to the circuits in a standard way to control their mode. Depending on the state of the signal NCE, the memory is used in normal mode (it is then possible to access this memory to program it and/or read it) or in low consumption mode. In the example, the memory is selected by positioning the signal NCE in the low state.

In the memories, the signal ATD is a standard signal produced by the decoding circuit to indicate that a change in state has occurred on one or more address inputs, in other words that a new address has been given to the memory. It will be assumed that the detection of a change in state is expressed by a positive pulse of determined duration in the signal ATD. The duration is generally far below the typical access time in read mode (namely the mean duration between the instant when an address is given to the memory and the instant when the corresponding signal or signals are produced by the read circuit or circuits).

Figure 4:
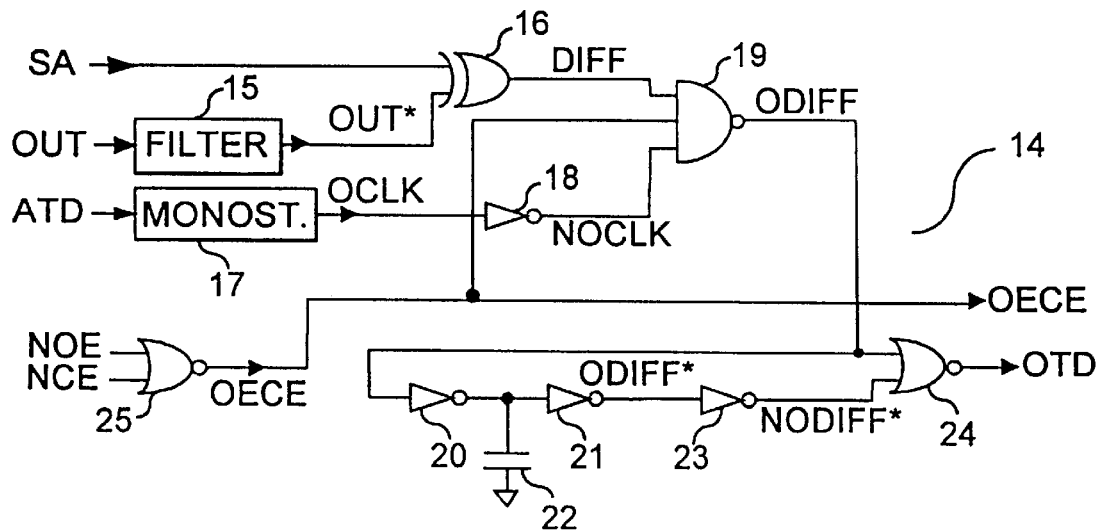
FIG. 4 shows a control circuit implemented in the circuit of FIG. 3 according to the invention.

FIG. 4 illustrates an exemplary embodiment of a part of the control circuit 14. The enable signal OECE is produced by a logic circuit 25. Its state is such that it is in a first state if the memory is selected and if the input/output 12 is configured as an output, and if not in a second state. The logic circuit 25 is a two-input NOR type logic gate that receives the signals NOE and NCE at its inputs and produces the signal OECE at an output. Thus, if the signals NCE and NOE are in the low state, a signal OECE in the high state is produced. This signal represents the fact that it is possible to read information elements in the memory that uses the buffer circuit 5b.

The circuit 14 includes a filtering circuit 15 to eliminate any parasitic pulses from the output signal OUT. This circuit produces a filtered logic signal OUT*.

The filtered signal OUT* is used to compare the input and output states of the buffer circuit 5b. To this end, the circuit 5b includes a comparison circuit 16 that produces a comparison logic signal DIFF whose state represents relative states of the signals SA and OUT. When the signals SA and OUT are in different states, the signal DIFF is in a first state. When these signals are in the same state, the signal DIFF is in the second state. In the example, the comparison circuit 16 is a two-input XOR type logic gate that receives the signals SA and OUT* at its inputs and produces the signal DIFF. The first state of the signal DIFF corresponds in the example to the high state and the second state corresponds to the low state.

A monostable circuit 17 is used for the production, from the signal ATD, of a clock signal OCLK in such a way that this signal OCLK goes into a first state during a determined period Toclk when an address transition is detected at input of the memory, and otherwise is in a second state. Typically, the monostable circuit will be sized in such a way that this period is, on the one hand, at least equal to the typical period between the time when an address is known to the memory and the time when the corresponding signals are produced by the read circuit or circuits and, secondly, smaller than the minimum time laid down between two successive address transitions. The first state of the signal OCLK corresponds in the example to a high state and the second state to a low state. The clock signal OCLK is used to produce the signal OTD.

The updating control signal OTD is produced by a logic circuit in such a way that it is made to undergo a transition from a first state to a second state when it is desired to store the state of the signal SA in the storage circuit 9. To do this, it is made to undergo first of all a first transition from the second state to the first state before being brought back to the second state. The signal OTD is therefore, in the example, a pulse signal. As shall be seen, it activates the latching of a D type flip-flop circuit. In the example, the first state considered will be the high state and the second state will be the low state.

When a reading operation is initiated by an address transition, the state of the signal SA resulting from this read operation is stored in the storage circuit 9 provided that, firstly, the input signal SA and output signal OUT are different and that, secondly, the signal OCLK is in its second state (in other words that the standard period of reading has elapsed). In the example, the storage in the circuit 9 is furthermore conditioned by the fact that the memory is selected (NCE=0) and that the input/output 12 is configured as an output.

To produce the signal OTD, an inverter 18 is implemented. This inverter 18 produces a logic signal NOCLK that is the reverse of the signal OCLK. A three-input NAND type logic gate 19 receives the signals DIFF, OECE and NOCLK at its inputs. This gate 19 uses received signals to produce a logic signal ODIFF. The signal ODIFF produced goes into a first state, as it happens the low state, when the conditions laid down to induce a storage of the input signal SA in the storage circuit 9 are all present. Otherwise, it is in a second state, in this case the high state.

A delay circuit produces a delayed logic signal ODIFF* from the signal ODIFF. This delay circuit has two inverters 20 and 21 that are series-connected and a capacitor 22. The inverter 20 receives the signal ODIFF at one input. An output of the inverter 20 is connected to an input of the inverter 21 and to a first pole of the capacitor 22. A second pole of the capacitor 22 is connected to the ground. The inverter 21 gives the signal ODIFF* at an output. An inverter 23 receives the signal ODIFF* at an input and produces a logic signal NODIFF* at an output. This logic signal NODIFF* is the reverse of the signal ODIFF*. A two-input NOR type logic gate 24 receives the signals ODIFF and NODIFF* at its input. This gate 24 produces the updating control signal OTD. The value of the capacitor 22 is used to set the length of the time during which the signal OTD goes to the high state. With the signal OTD being given to a D type flip-flop circuit as the storage circuit 9, the state of the signal SA will be stored in this flip-flop circuit when a trailing edge appears in the signal OTD.

Figure 5:
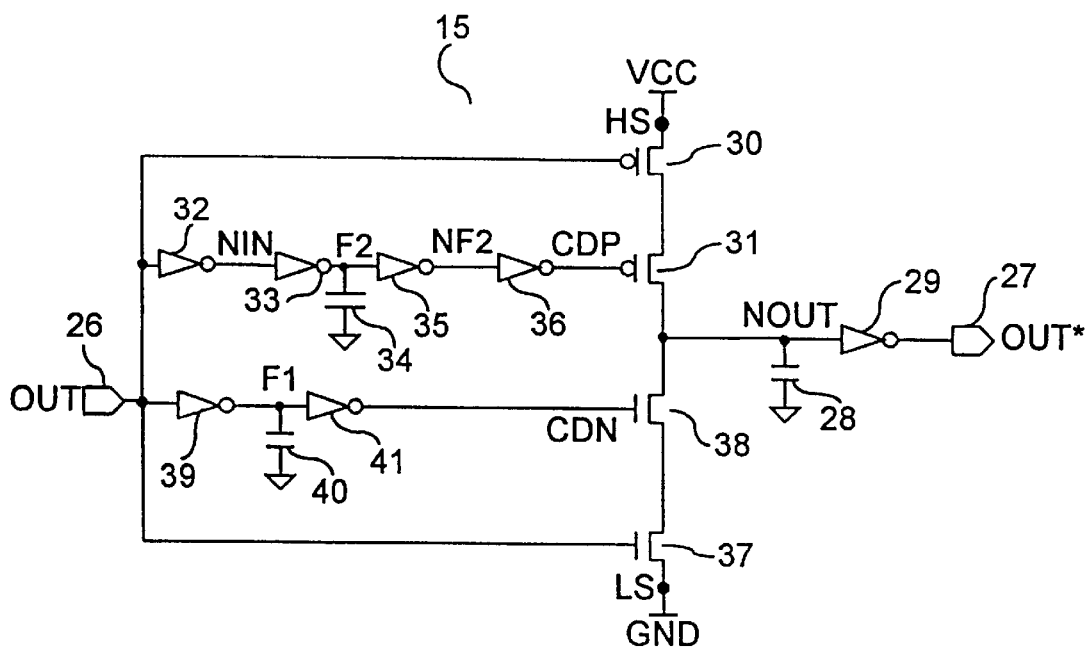
FIG. 5 shows a filtering circuit implemented in the control circuit illustrated in FIG. 4.

FIG. 5 illustrates an example of a filtering circuit 15. This filtering circuit 15 includes an input 26 to receive the logic signal OUT to be filtered and an output 27 to produce the filtered signal OUT* from the signal OUT. The circuit comprises a first inverter type stage that produces a signal NOUT accessible at the terminals of a storage capacitor 28. The signal OUT* is produced by an inverter 29 from the signal NOUT.

The first inverter type stage includes a connection circuit to connect a first terminal of the capacitor 28 to electrical reference nodes HS and LS, the potentials of which respectively represent high and low states that can be assumed by the signal OUT. A second terminal of the capacitor is connected to a ground. The connection circuit has MOS type transistors controlled as a function of the state of the input signal OUT. To connect the first terminal of the capacitor to the node HS (taken to the potential VCC), two P channel MOS type transistors 30 and 31 are used. The source of the transistor 30 is connected to the node HS. Its control gate receives the signal OUT. Its drain is connected to the source of the transistor 31. The drain of the transistor 31 is connected to the first terminal of the capacitor 28. Its control gate receives a control logic signal CDP produced from the signal OUT.

To produce the signal CDP, an inverter 32 is used. This inverter 32 receives the signal OUT at input and produces a logic signal NIN that is the reverse of the signal OUT. An inverter 33 receives the signal NIN at input. The inverter 33 has an output connected to a first terminal of a capacitor 34. The capacitor 34 has a second terminal that is connected to the ground. F2 denotes the signal present at the first terminal of the capacitor 34. An inverter 35 has one input connected to this first terminal and produces a logic signal NF2 at an output. An inverter 36 receives the signal NF2 at one input and produces the signal CDP by inversion of the signal NF2.

To connect the first terminal of the capacitor to the node LS (taken to the potential GND), two N channel MOS type transistors 31 and 38 are used. The source of the transistor 37 is connected to the node LS. Its control gate receives the signal OUT. Its drain is connected to the source of the transistor 38. The drain of the transistor 38 is connected to the first terminal of the capacitor 28. Its control gate receives a control logic signal CDN produced from the signal OUT.

To produce the signal CDN, an inverter 39 is used. This inverter receives the signal OUT at output and has one output connected to a first terminal of a capacitor 40. The capacitor 40 has a second input connected to the ground. F1 refers to the signal present at the first terminal of the capacitor 40. An inverter 41 has an input connected to this first terminal and produces the signal CDN at an output.

The transistors 31 and 38 are used to filter the parasitic pulses. A parasitic pulse will be defined as a pulse with a duration smaller than a given duration, typically of about one nanosecond.

The transistors 30 and 37 are controlled in such a way that the nodes HS and LS are always insulated from one another. This makes it possible to avoid the production of parasitic pulses by the short-circuiting of the nodes HS and LS when the signal OUT changes its state.

Let it be assumed that the signal OUT is in the high state and that a trailing edge appears in the signal. Before the edge appears, the transistors 37 and 38 are on and the transistors 30 and 31 are off. The first terminal of the capacitor 28 is then connected to the ground and consequently the signal OUT* is in the high state. When the trailing edge appears, the transistor 37 goes off and the transistor 30 comes on. The capacitors 40 and 34 respectively get charged and discharged. So long as the switch-over thresholds of the inverters 41 and 35 have not been reached, the control signals CDN and CDP remain in the states in which they were before the appearance of the edge. In other words, the transistor 38 is on and the transistor 31 is off. The capacitor 28 is then insulated from the nodes HS and LS and maintains the signal OUT* in the high state.

If the signal OUT remains in the low state, the transistors 31 and 38 will respectively become on and off once the switch-over thresholds of the inverters 35 and 41 are reached. The capacitor 28 is then connected to the node HS and will get charged, leading to a passage of the signal OUT* to the low state.

If the signal OUT goes back to the high state before the thresholds of the inverters 41 and 35 have been reached, there will be a return to the configuration preceding the appearance of the trailing edge. The transistors 30 and 37 will respectively become off and on and the capacitor 28 will be connected to the node LS. Since the transistor 31 has never been on, the negative pulse demarcated by the successive edges will have been ignored.

The maximum width of the negative pulses that are filtered is determined by the dimensioning of the capacitor 34 and of the resistance between the output of the inverter 33 and the ground (namely for a standard CMOS inverter by the dimensions of the N channel MOS transistor mounted between this output and the ground), this capacitor and this resistor defining an RC filter through which the capacitor 34 is discharged.

Let it be assumed that the signal OUT is in the low state and that a leading edge appears in the signal. Before the edge appears, the transistors 30 and 31 are on and the transistors 37 and 38 are off. The first terminal of the capacitor 28 is then connected to the node HS and the signal OUT* is in the low state.

When the leading edge appears, the transistor 30 goes off and the transistor 37 comes on. The capacitors 34 and 40 will respectively get charged and discharged. So long as the switch-over thresholds of the inverters 35 and 41 have not been reached, the control signals CND and CDP remain in the states in which they were before the appearance of the edge. In other words, the transistor 31 is on and the transistor 38 is off. The capacitor 28 is then insulated from the nodes HS and LS and keeps the signal OUT* in the low state.

If the signal OUT remains in the high state, the transistors 38 and 31 will become respectively on and off once the switch-over thresholds of the inverters 41 and 35 are reached. The capacitor 28 is then connected to the node LS and will get discharged, leading the signal OUT* to pass to the high state.

If the signal OUT goes back to the low state before the thresholds of the inverters 41 and 35 have been reached, there will be a return to the configuration preceding the appearance of the leading edge. The transistors 37 and 30 will respectively return to the off and on states and the capacitor 28 will be connected to the node HS. Since the transistor 38 has never been on, the positive pulse demarcated by the successive edges will have been ignored.

The maximum width of the positive pulses that are filtered is determined by the size of the capacitor 40 and of the resistor between the output of the inverter 39 and the ground (namely for a standard CMOS inverter, by the dimensions of the N channel MOS transistor mounted between this output and the ground), this capacitor and this resistor defining an RC filter through which the capacitor 40 is discharged.

Figure 6:
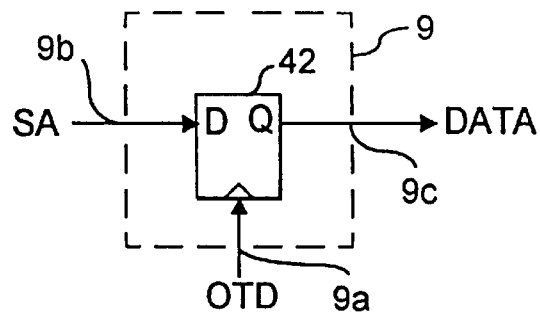
FIG. 6 shows a storage circuit implemented in the buffer circuit according to the invention.

FIG. 6 illustrates an exemplary embodiment of the storage circuit 9. It comprises a D type flip-flop circuit 42 receiving the signal SA at its input D, giving the signal DATA at its output Q, its operation being controlled by the signal ODT.

Figure 7:
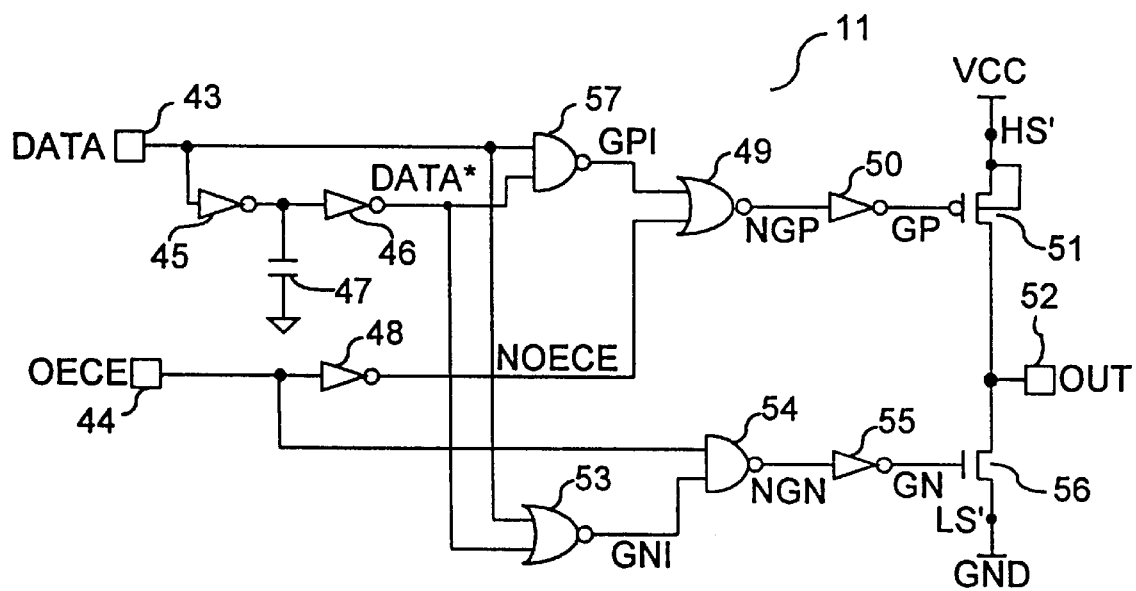
FIG. 7 shows an output circuit implemented in the buffer circuit according to the invention.

FIG. 7 illustrates an exemplary embodiment of the output stage 11.

A delay circuit is used to produce a delayed logic signal DATA* from the signal DATA. This delay circuit comprises two series-connected inverters 45 and 46 and a capacitor 47. The inverter 45 receives a signal DATA at ONE input. An output of the inverter 45 is connected to an input of the inverter 46 and to a first pole of the capacitor 47. A second pole of the capacitor 47 is connected to a ground. The inverter 46 gives the signal DATA* at an output.

A NAND type logic gate 57 with two inputs and one output receives the signals DATA and DATA* at its inputs and produces a logic signal GPI at its output. An inverter 48 receives the signal OECE at an input and produces a logic signal NOECE which is the reverse of the signal OECE. A NOR type logic gate 49 receives the signals GPI and NOECE at two inputs and produces a logic signal NGP at an output. An inverter 50 receives the signal NGP at an input and produces a logic signal GP at an output. This logic signal GP is the reverse of the signal NGP.

A P channel MOS type transistor 51 is used to impose the potential VCC at the output 52. The control gate of the transistor 51 receives the signal GP. Its source is connected to a node HS' which is at the potential VCC, and its drain is connected to the output 52.

A NOR type logic gate 53 receives the signals DATA and DATA* on two inputs and produces a logic signal GNI at output. A NAND type logic gate 54 receives the signals GNI and OECE on two inputs and produces a logic signal NGN on an output. An inverter 55 receives the signal NGN on one input and, from this signal NGN, produces a logic signal GN at an output. This logic signal GN is the reverse of the signal NGN. An N channel MOS type transistor 56 is used to impose the potential GND on the output 52. The transistor 56 has its source connected to a node LS' which is at the potential GND. Its drain is connected to the output 52. Its control gate receives the signal GN. Let us assume that the signals DATA and DATA* are in the high state and that the signal DATA goes to the low state following a read operation.

Initially, before the state transition, the signals GPI and GNI are in the low state. Consequently, if it is assumed that the memory is selected and that the input/output 12 is configured as an output, the signals NGP and NGN are in the high state. The signals GP and GN are therefore in the low state. The transistor 51 is therefore on and the transistor 56 is off. The output signal OUT is therefore in the same state as the signal DATA.

When the signal DATA goes to the low state, the signal GPI goes to the high state. The signal GNI remains unchanged so long as the signal DATA* has not changed its state. The signal GPI having gone to the high state, the signal NGP will go to the low state and the signal GP will go to the high state, turning the transistor 51 off. Once the signal DATA* goes to the low state, the signal GNI goes to the high state. Consequently, the signal NGN goes to the low state and the signal GN goes to the high state. The transistor 56 comes on and the signal OUT then goes to the same state as the signal DATA.

If the value of the capacitor 47 is chosen with respect to the time taken by the signals to cross the logic circuits in such a way that the transistors 51 and 56 are off simultaneously before the transistor 56 comes on, the production of noise on the supply is prevented. Thus, this prevents the disturbance of the operation of the circuits such as the read circuit. This also thus prevents the creation of a resistive consumption in the transistors 51 and 56. This is all the more worthwhile as large-sized transistors are used, capable of delivering high current. By contrast, the maintenance of the state of the signal OUT at output will then be conditioned by the value of the equivalent capacitance perceived by the buffer circuit 5b at its output 52. The maintenance of the output state therefore assumes that the output 52 is not isolated, in which case this output would be floating. Care is taken therefore not to choose an excessive value for the capacitance 47 so as not to excessively prolong this state of high impedance.

Let it be assumed now that the signals DATA are in the low state and that the signal DATA goes to the high state following a read operation.

Initially, before the state transition, the signals GPI and GNI are in the high state. Consequently, if it is assumed that the memory is selected and that the input/output 12 is configured at output, the signals NGP and NGN are in the low state. The signals GP and GN are therefore in the high state. The transistor 56 is therefore on and the transistor 51 is off. The output signal OUT is therefore in the same state as the signal DATA.

When the signal DATA goes to the high state, the signal GNI goes to the low state. The signal GPI remains unchanged so long as the signal DATA* has not changed its state. The signal GNI having gone to the low state, the signal NGN will go the high state and the signal GN will go to the low state, turning the transistor 56 off. Once the signal DATA* goes to the high state, the signal GPI goes to the low state. Consequently, the signal NGP goes to the high state and the signal GP goes to the low state. The transistor 51 comes on and the signal OUT goes into the same state as the signal DATA. A description shall now be given of a few examples illustrating the behavior of the output buffer circuit 5b.

1—'Standard' Reading, When the Signal OCLK is in the High State

This example is illustrated in FIGS. 8a to 8h.

It is assumed that the signal OECE is in the high state and that the signals SA, DATA and OUT (illustrated in FIGS. 8d, 8g and 8h) are in the same state, for example the low state. The comparison signal DIFF (illustrated in FIG. 8e) is therefore in the low state. Consequently, the signal OTD (illustrated in FIG. 8f) is in the low state. At the same time, the signals ATD and OCLK (illustrated in FIGS. 8b and 8c) are in the low state.

Let it be assumed that the memory detects a transition on the address input ADD (illustrated in FIG. 8a).

The signal ATD will rise to the high state before falling back to the low state. Consequently, the signal OTD will rise to the high state for a period Toclk.

If the state of the signal SA corresponding to the new address is identical to the previous state, the signal DIFF remains in the low state. Consequently, the signal OTD will remain also in the low state. The contents of the flip-flop circuit 42 are therefore not updated and the signals DATA and OUT remain in the same state.

If the state of the signal SA corresponding to the new address is different from the previous state (the case illustrated in FIGS. 8a to 8h), the signal DIFF will rise to the high state when this new state is given by the circuit 10 (it is assumed here that it is given while the signal OCLK is in the high state).

At the end of the period Toclk, the descent of the signal OCLK to the low state will prompt a rise of the signal NOCLK to the high state. Consequently, the signal OTD will rise to the high state. Subsequently it falls back to the low state, thus prompting the updating of the contents of the flip-flop circuit 42. The signal DATA will therefore go to the high state, thus leading to a rise of the signal OUT to the high state.

2—'Slow' Reading, Once the Time Toclk has Elapsed

This example is shown in FIGS. 9a to 9h.

It is assumed that the signal OECE is in the high state and that the signals SA, DATA and OUT (illustrated in FIGS. 9d, 9g and 9h) are in the same state, for example the low state. The comparison signal DIFF (illustrated in FIG. 9e) is therefore in the low state. Consequently, the signal OTD (illustrated in FIG. 9f) is in the low state.

At the same time, the signals ATD and OCLK (illustrated in FIGS. 9b and 9c) are in the low state.

Let it be assumed that the memory detects a transition at the address input ADD (illustrated in FIG. 9a). The signal ATD will rise to the high state before falling back to the low state. Consequently, the signal OTD rises to the high state for a period Toclk. It is assumed here that the state of the signal SA corresponding to the new address is given by the circuit 10 once the period Toclk has elapsed.

If the new state of the signal SA is identical to the previous state, the signal DIFF remains in the low state. Consequently, the signal OTD will also remain in the low state. The contents of the flip-flop circuit 42 are therefore not updated and the signals DATA and OUT remain in the same state.

If the state of the signal SA corresponding to the new address is different from the previous state (the case illustrated in FIGS. 9a to 9h), the signal DIFF will rise to the high state when this new state is given by the circuit 10. The signal NOCLK is then in the high state. Consequently, the signal OTD will rise to the high state. Subsequently, it falls back to the low state, thus prompting the updating of the contents of the flip-flop circuit 42. The signal DATA will therefore go to the high state, thus causing the signal OUT to rise to the high state.

3—Modification of the Selection of Direction of Transfer

This example is illustrated in FIGS. 10a to 10f.

Figure 10A:
FIGS. 10a to 10f represent timing diagrams of logic signals representing the operation of the buffer circuit when an output of this circuit is placed in a state of high impedance.
Figure 10B:
Figure 10C:
Figure 10D:
Figure 10E:
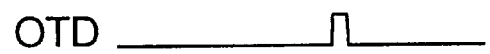
Figure 10F:
Figure 11A:
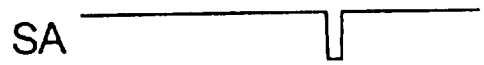
FIGS. 11a to 11f represent timing diagrams of logic signals representing the operation of the buffer circuit when a parasitic pulse disturbs the state of the input signal.
Figure 11B:
Figure 11C:
Figure 11D:
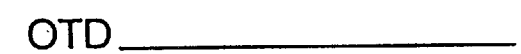
Figure 11E:
Figure 11F:

We shall now study the influence of the placing of the output 52 in a state of high impedance by modification of the state of the signal NOE (illustrated in FIG. 10a). It shall be assumed that the signals SA, DATA and OUT (illustrated in FIGS. 10c, 10f and 10b) are in the same state, for example the low state and that the signal NOE is then in the low state.

Figure 2:
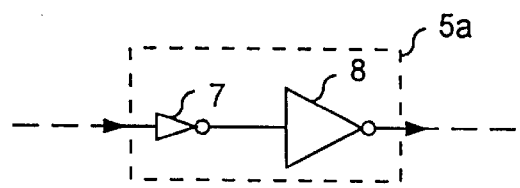
FIG. 2 shows a buffer circuit according to the prior art.

If the signal NOE goes to the high state, the selection signal OECE goes to the low state. Consequently, the signals GP and GN respectively go to the high state and low state, turning the transistors 51 and 56 off. The output 52 of the output stage is then insulated from the rest of the output stage. This would not be the case with the circuit of FIG. 2. It can be seen here that the presence of the switch 13 is not necessary.

It may happen that the state of the signal OUT gets modified, for example if the switch 13 is absent and a high state is enforced on the output 12, or else following leakages. The signal DIFF (illustrated in FIG. 10d) will then rise to the high state. As soon as the signal NOE has returned to the low state, the system will again be in the configuration corresponding to the example 2. In other words, a modification of the signal OTD (illustrated in FIG. 10e) will be produced. This modification updates the contents of the flip-flop circuit 42. At the same time, the signal OECE will return to the high state and the signal OUT is then set in the state preceding the modification of the signal NOE, this state being subsequently confirmed by the updating of the flip-flop circuit 42.

4—Parasitic Pulse in the Signal SA During the Period Toclk

This example is illustrated in FIGS. 11a to 11f.

Let us assume that the signals SA, DATA and OUT (illustrated in FIGS. 11a, 11e and 11f) are in the same state, for example the high state.

If an address transition is detected, the signal OCLK (illustrated in FIG. 11b) will go to the high state. If a negative parasitic pulse appears then in the input signal SA, the signal DIFF will change its state and rise to the high state.

The signal OTD, initially in the low state, will not be modified by this change in state of the signal DIFF inasmuch as the parasitic pulse disappears before the signal OCLK has returned to the low state. On this assumption, the signals DATA and OUT will remain unchanged. With the circuit of FIG. 2, a pulse of this kind would have provoked an untimely modification of the output signal.

Although the buffer circuit according to the invention has been described with reference to its application in memory, it goes without saying that this application is not exclusive. It is quite possible to modify the circuit, without departing from the context of the invention, in order to adapt it to other applications.

Thus, it is possible to make an independent buffer circuit, namely a circuit whose operation is not conditioned by external control signals. It will suffice to modify the control circuit and possibly the output stage accordingly. For example, if the enable signal OECE is unnecessary, it is possible not to produce it. A two-input gate 19 will then be used and the gates 49 and 54 will be replaced by inverters. Similarly, it is possible to eliminate the elements pertaining to the production of the signal OCLK which is of value in memories for which a change in state requires a certain period of time but is not necessary, for example, if the circuit 10 is simply a logic circuit. Then, similarly, the gate 19 will be replaced by a two-input gate or even by an inverter if the signal OECE is not produced.

Finally, it is clear that it is possible to modify the polarity of the signals produced and/or use different logic circuits to produce them without going beyond the scope of the invention which cannot be limited to the particular embodiment described herein by way of an example.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An output buffer circuit for logic signals producing an output logic signal from an input logic signal, said output buffer circuit comprising:

an input stage including a storage circuit capable of storing the logic state of the input signal when an updating command signal is received, an output stage to produce the output signal as a function of the logic state stored in the storage circuit, and a control circuit providing a first control signal to the input stage to control storage of the input signal, and a second control signal to the output stage to control outputting of the output signal, the control circuit being connected to receive the input signal and the output signal, the control circuit including a comparison circuit receiving the input signal and the output signal and outputting the first control signal when the input signal and the output signal have different states, the control circuit including a comparison delay circuit which delays output of the first control signal until a predetermined time after receipt of an input signal.

2. The circuit according to claim 1, wherein the control circuit includes means to produce a clock signal and to produce the updating signal so that the state of the input signal can be stored in the storage circuit only on condition that the clock signal is in a first state and that a logic comparison signal produced by the comparison circuit is simultaneously in a second state.

3. An output buffer circuit for logic signals producing an output logic signal from an input logic signal, said output buffer circuit comprising:

a storage circuit capable of storing the logic state of the input signal when an updating command signal is received, an output stage to produce the output signal as a function of the logic state stored in the storage circuit, and a control circuit including a comparison circuit for the comparison of the input and output signals, the control circuit producing the updating command signal to the storage circuit whose logic state represents the relationship existing between the logic states of the input and output signals wherein the control circuit comprises a circuit for filtering of the output signal to eliminate the parasitic pulses from the output signal, the comparison circuit receiving the input signal and a filtered output signal produced by the filtering circuit from the output signal.

4. The circuit according to claim 1, wherein the output stage comprises:

an output to give the output signal, connection means for the selective connection, as a function of the state stored in the storage circuit, of the output of the state to electrical nodes whose potentials represent states that can be taken by the output logic signal, and control means to produce control signals for the connection means, the control signals being produced so that the output cannot be connected to more than one node at a time, the control means comprising a delay circuit to delay the modification of the control signals in such a way that, before the output is connected to a node, this output is isolated from the other node or nodes.

5. The circuit according to claim 4, wherein the output stage comprises a control input to receive an enable logic signal, this signal being combined with an intermediate signal given by the storage circuit to produce the control signals for the connection means in such a way that states of these control signals represent the state of the intermediate signal when the enable signal is in a first state, and that the states of these control signals are such that the output is isolated from all the nodes when the enable signal is in a second state.

6. The circuit according to claim 1, wherein the storage circuit comprises a flip-flop circuit to store the state of the input signal.

7. The circuit according to claim 6, wherein the control circuit comprises means to produce the updating command signal in pulse form.

8. An output buffer circuit comprising:

an input stage, including a memory circuit, receiving and storing an input signal to be outputted;

an output stage, connected to the memory circuit of the input stage, outputting an output signal based upon a state of the input signal stored in the memory circuit; and a control circuit providing a first control signal to the input stage to control storage of the input signal, and a second control signal to the output stage to control outputting of the output signal, the control circuit being connected to receive the input signal and the output signal, the control circuit including a comparison circuit receiving the input signal and the output signal and outputting the first control signal when the input signal and the output signal have different states, the control circuit including a comparison delay circuit which delays output of the first control signal until a predetermined time after receipt of an input signal.

9. The output buffer circuit of claim 8, wherein said memory circuit includes a flip-flop, and wherein the comparison circuit includes a pulse circuit generating the first control signal as a pulse of predetermined duration when the input signal and output signal have different states.

10. An output buffer circuit comprising:

an input stage, including a memory circuit, receiving and storing an input signal to be outputted;

an output stage, connected to the memory circuit of the input stage, outputting an output signal based upon a state of the input signal stored in the memory circuit; and a control circuit providing a first control signal to the input stage to control storage of the input signal, and a second control signal to the output stage to control outputting of the output signal;
wherein the control circuit further includes a filter circuit which receives the output signal and provides a filtered output signal to the comparison circuit.

11. The output buffer circuit of claim 10, wherein said filter circuit filters the output signal to eliminate pulses of less than a predetermined duration.

12. The output buffer circuit of claim 8, wherein the control circuit includes an enabling circuit receiving at least one enabling signal to enable the output buffer circuit and prohibiting output of the first control signal and second control signal when the at least one enable signal is an a predetermined state.

13. The output buffer circuit of claim 8, wherein the output stage includes:
an output terminal;
a first electrical node having a potential representing a first state;
a second electrical node having a potential representing a second state; and
an output stage control circuit selectively connecting the output terminal to one of the first electrical node and second electrical node.

14. The output buffer circuit of claim 13, wherein said output stage control circuit is arranged to disconnect the output terminal from the first electrical node and the second electrical node when the second control signal is in a predetermined state.

15. The output buffer circuit of claim 13, wherein said output stage control circuit selectively connects the output terminal to one of the first electrical node and second electrical node based upon the state stored in the memory circuit.

16. The output buffer circuit of claim 14, wherein said output stage control circuit includes:
a disconnection circuit to disconnect the output terminal from one of the first electrical node and second electrical node when the state stored in the memory circuit changes from a first state to a second state; and
a connection circuit to connect the output terminal to another of the first electrical node and second electrical node when the state stored in the memory circuit after operation of the disconnection circuit.

17. A memory circuit comprising:
a memory array;
a reading circuit connected to the memory array to read the state of a specified location in the memory array and generate an input signal to be outputted; and
an output buffer circuit connected to the reading circuit to receive the input signal, the output buffer circuit including:
an input stage, including a output memory circuit, receiving and storing an input signal to be outputted;
an output stage, connected to the output memory circuit of the input stage, outputting an output signal based upon a state of the input signal stored in the memory circuit; and
a control circuit providing a first control signal to the input stage to control storage of the input signal, and a second control signal to the output stage to control outputting of the output signal, the control circuit being connected to receive the input signal and the output signal, the control circuit including a comparison circuit receiving the input signal and the output signal and outputting the first control signal when the input signal and the output signal have different states, the control circuit including a comparison delay circuit which delays output of the first control signal until a predetermined time after receipt of a signal representing a request to read the memory array.

18. The memory circuit of claim 17, wherein the control circuit is connected to receive the input signal and the output signal, the control circuit including a comparison circuit receiving the input signal and the output signal and outputting the first control signal when the input signal and the output signal have different states.

19. The memory circuit of claim 18, wherein said output memory circuit includes a flip-flop, and wherein the comparison circuit includes a pulse circuit generating the first control signal as a pulse of predetermined duration when the input signal and output signal have different states.

20. The memory circuit of claim 17, wherein the control circuit includes an enabling circuit receiving at least one enabling signal to enable the output buffer circuit and prohibiting output of the first control signal and second control signal when the at least one enable signal is an a predetermined state.

21. The memory circuit of claim 18, wherein the comparison circuit includes:
a comparison delay circuit which delays output of the first control signal until a predetermined time after receipt of a signal representing a request to read the memory array.

22. The memory circuit of claim 17, wherein the output stage includes:
an output terminal;
a first electrical node having a potential representing a first state;
a second electrical node having a potential representing a second state; and
an output stage control circuit selectively connecting the output terminal to one of the first electrical node and second electrical node.

23. The memory circuit of claim 22, wherein said output stage control circuit is arranged to disconnect the output terminal from the first electrical node and the second electrical node when the second control signal is in a predetermined state.

24. The output buffer circuit of claim 22, wherein said output stage control circuit includes:
a disconnection circuit to disconnect the output terminal from one of the first electrical node and second electrical node when a state stored in the output memory circuit changes from a first state to a second state; and
a connection circuit to connect the output terminal to another of the first electrical node and second electrical node when the state stored in the memory circuit after operation of the disconnection circuit.

25. A method for buffering a logical output comprising the steps of:
receiving a logical input to be outputted;
receiving signal representing a request to read a memory array;
storing the logical input after a predetermined time after receipt of the signal representing the request to read the memory array if the logical input is different from a prior logical output;

outputting the stored logical input as the logical output.

26. The method of claim 25, wherein the storing step includes the step of comparing the received logical input with the prior logical output.

27. The method of claim 25, wherein the logical input signal is to be stored in a flip-flop memory circuit, and wherein the storing step includes the steps of:

comparing the received logical input with the prior logical output;

generating a pulse signal to the flip-flop if the received logical input differs from the prior logical output; and storing the logical input in a flip-flop memory circuit based upon the pulse signal.

28. The method of claim 26, further comprising the step of filtering the prior logical output before the comparing step.

29. The method of claim 28, wherein filtering step filters the prior logical output to eliminate pulses of less than a predetermined duration.

30. The method of claim 25, further comprising the step of receiving at least one enabling signal to enable output; and wherein the storing step is prohibited unless the at least one enabling signal is received.

31. The method of claim 30, wherein the outputting step includes selectively connecting the output terminal to one of a first electrical node and a second electrical node, the first electrical node having a potential representing a first state, and the second electrical node having a potential representing a second state;

the method further comprising the step of disconnecting the output terminal from the first electrical node and the second electrical node when the at least one enabling signal is not received.

32. The method of claim 25, wherein the outputting step includes the step of selectively connecting the output terminal to one of a first electrical node and a second electrical node, the first electrical node having a potential representing a first state, and the second electrical node having a potential representing a second state.

33. The method of claim 32, wherein the outputting step further includes the steps of:

disconnecting the output terminal from one of the first electrical node and second electrical node when the stored input signal changes from a one state to another state; and connecting the output terminal to another of the first electrical node and second electrical node after the disconnecting step.

* * * * *